(12) United States Patent
Stojaković et al.

(10) Patent No.: US 9,319,247 B2
(45) Date of Patent: Apr. 19, 2016

(54) METHOD AND DEVICE FOR BROADBAND HIGH ISOLATION COUPLING

(71) Applicant: Rohde & Schwarz GmbH & Co. KG, Munich (DE)

(72) Inventors: Nenad Stojaković, Essen (DE); Reiner Franke, Velbert (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 14/418,841

(22) PCT Filed: Oct. 17, 2012

(86) PCT No.: PCT/EP2012/070541
§ 371 (c)(1),
(2) Date: Jan. 30, 2015

(87) PCT Pub. No.: WO2014/060026
PCT Pub. Date: Apr. 24, 2014

(65) Prior Publication Data
US 2015/0215137 A1   Jul. 30, 2015

(51) Int. Cl.
*H04L 25/02* (2006.01)
*H03F 1/42* (2006.01)
*H03F 3/38* (2006.01)
*H04L 25/08* (2006.01)

(52) U.S. Cl.
CPC .............. *H04L 25/0266* (2013.01); *H03F 1/42* (2013.01); *H03F 3/38* (2013.01); *H04L 25/0268* (2013.01); *H04L 25/085* (2013.01); *H03F 2200/333* (2013.01); *H03F 2200/429* (2013.01)

(58) Field of Classification Search
CPC .... H04B 1/0064; H04B 1/0057; H04B 1/006; H04B 1/0085; H04B 5/0075; H04B 5/005; H04L 5/14; H04L 25/0266; H04L 25/0268
USPC .................................. 375/258, 350, 260, 222
See application file for complete search history.

(56) References Cited

U.S. PATENT DOCUMENTS

| | | | | |
|---|---|---|---|---|
| 2,961,614 A | * | 11/1960 | Neff ............................ | H03F 3/40 330/10 |
| 2,999,129 A | * | 9/1961 | Lynch ........................ | H04J 3/00 370/498 |
| 3,241,080 A | | 3/1966 | Hinrichs | |
| 3,375,326 A | * | 3/1968 | Parkyn et al. ................. | 348/694 |
| 3,525,936 A | * | 8/1970 | Vosteen ............. | G01R 19/0084 324/458 |
| 3,585,518 A | * | 6/1971 | Hitt ........................... | H03C 1/36 330/10 |
| 3,821,797 A | * | 6/1974 | Suzuki et al. .................... | 360/24 |
| 4,195,202 A | * | 3/1980 | McCalmont .................... | 380/39 |
| 4,461,987 A | * | 7/1984 | Fulton .................... | H02M 7/525 318/729 |
| 4,608,541 A | | 8/1986 | Moriwaki et al. | |
| 4,754,486 A | * | 6/1988 | Stafford et al. .................. | 381/86 |

(Continued)

*Primary Examiner* — Emmanuel Bayard
(74) *Attorney, Agent, or Firm* — Ditthavong & Steiner, P.C.

(57) ABSTRACT

An isolation coupler comprises a frequency splitter (36) for splitting an input signal (1) into a low frequency partial signal (2) and a high frequency partial signal (4) and a first isolating transformer (33) for transforming a signal derived from the high frequency partial signal (4) in a transformed high frequency partial signal (5). Moreover it may include a modulator (21) for modulating the low frequency partial signal (2) with a modulation signal (6) resulting in a modulated low frequency partial signal (7) and a second isolating transformer (34) for transforming a signal derived from the modulated low frequency partial signal (7) in a transformed low frequency partial signal (8).

13 Claims, 2 Drawing Sheets

(56) References Cited

U.S. PATENT DOCUMENTS

| | | | |
|---|---|---|---|
| 5,027,222 A * | 6/1991 | Shinbo et al. | 386/308 |
| 5,517,154 A | 5/1996 | Baker et al. | |
| 5,534,932 A * | 7/1996 | Van de Waterlaat et al. | 348/432.1 |
| 5,991,416 A * | 11/1999 | Bae | 380/39 |
| 6,064,694 A * | 5/2000 | Clark et al. | 375/224 |
| 6,356,386 B1 * | 3/2002 | Denkin et al. | 359/337 |
| 6,850,618 B1 * | 2/2005 | Mohajeri et al. | 379/399.01 |
| 8,072,669 B2 * | 12/2011 | Zhou | H04B 10/505 359/238 |
| 8,077,375 B2 * | 12/2011 | Zhou | H04B 10/5053 359/238 |
| 8,953,896 B2 * | 2/2015 | Lee et al. | 382/232 |
| 2003/0081120 A1 * | 5/2003 | Klindworth | G08B 13/19634 348/143 |
| 2004/0202204 A1 * | 10/2004 | Dong | H04L 25/0268 370/533 |
| 2006/0024064 A1 * | 2/2006 | Hecker | H04B 10/532 398/152 |
| 2007/0161357 A1 * | 7/2007 | Tudosoiu et al. | 455/129 |
| 2008/0152152 A1 * | 6/2008 | Kimura | H04S 7/30 381/17 |
| 2013/0195467 A1 * | 8/2013 | Schmid et al. | 398/115 |
| 2014/0185829 A1 * | 7/2014 | Bongiovi et al. | 381/103 |
| 2014/0340578 A1 * | 11/2014 | Kobayashi | 348/448 |

* cited by examiner

METHOD AND DEVICE FOR BROADBAND HIGH ISOLATION COUPLING

CROSS-REFERENCE TO RELATED APPLICATION

The present application is a national phase application of PCT Application No. PCT/EP2012/070541, filed Oct. 17, 2012, the entire contents of which are herein incorporated by reference.

BACKGROUND OF THE INVENTION

1. Field of the Invention

The invention, according to the various embodiments described herein, relates to coupling a broadband signal without a galvanic connection.

2. Discussion of the Background

For galvanically separating measurement signals, isolating transformers are well suited. It is though not possible to transform durational current (direct current), DC, through transformers. The relationship of an upper cut-off frequency to a lower cut-off frequency of transformers can reach a factor of 500, if the transformers are connected to resistors on both sides and comprise a highly permeable magnetic core. It is even possible to further increase this factor.

For coupling the complete signal galvanically separated, it is necessary to couple a durational current part of the input signal. This durational current signal part can for example be coupled using optical couplers. The bandwidth which can be reached using such a system is limited by the bandwidth of the optocoupler and of the transformer. For example, if the optocoupler reaches a bandwidth of 500 kHz and the transformer has a relative bandwidth of 500:1, the system can maximally have a bandwidth of 500×500 kHz=250 MHz. This theoretical calculation, though, is very optimistic. In reality, far lower system bandwidths are reached. Moreover, a system using optocouplers and transformers is prone to offset errors. Also, merely a low signal-to-noise ratio is attainable using such systems.

Furthermore, it known from the state of the art to modulate the entire input signal with a rectangle signal with a frequency of at least double the highest frequency component of the input signal. This modulated input signal is then transformed entirely through a single transformer. This isolation coupler, though, comprises several disadvantages. Since it is necessary to modulate the signal with the double frequency than the highest frequency component, a large percentage of the attainable bandwidth of the transformer is wasted. Moreover, if the theoretical bandwidth of the transformer is used to a high degree, production tolerance is a significant factor for the attainable accuracy and signal-to-noise ratio.

SUMMARY OF THE INVENTION

An isolation coupler and a method for coupling a signal, which reach a high signal-to-noise ratio and allow a low-complexity set up is provided herein.

For achieving maximal bandwidth of transformers, a high frequency partial signal may be transformed through an isolating transformer, which has a high absolute and relative bandwidth. According to one embodiment, a low frequency partial signal may be modulated with a rectangle signal. The high frequency partial signals and low frequency partial signals may be transformed using two different isolated transformers. Therefore, the modulation frequency can be chosen significantly lower than the bandwidth of the transformers. It is preferably chosen far higher than the maximal frequency of the low frequency partial signal in order to ease the filtering of the demodulated signal.

In another embodiment, frequency splitting of the input signal and a combination of the transformed signals can be reached using the subtraction method. The input signal may be filtered using a low pass. This low pass partial signal may be subtracted from the input signal. The resulting partial signal may include no durational current, DC, aspect and therefore can be coupled using an isolating transformer directly. The low pass partial signal may be then modulated using a modulator and thereby transformed into a frequency range, which can be transformed using a second isolating transformer. Alternatively, a sinusoidal signal may be used for modulating the low frequency partial signal. This results in a restriction of the bandwidth of the modulated signal to the double bandwidth of the low pass filter. Usually, a rectangle signal is used for the modulation.

For demodulating, a synchronous demodulation signal, which may be identical to the modulation signal, may be used.

If a rectangle signal is used, as many harmonics as possible of the modulation signal may be transformed. If the bandwidth of the transformers is changed, the transformation factor of the modulated transformation may be changed since not all harmonics take part in signal reconstruction to the same amount.

A significant disadvantage of the modulation of the state of the art is that the modulation and demodulation have to be performed synchronously. Since the modulation products have to be filtered before combining the high frequency partial signal and the low frequency partial signal, the modulation frequency has to be significantly higher than the low pass filter cut-off frequency. If the transmission of the modulation signal and of the modulated signal comprises small time delays of a fraction of the modulation frequency, this effects the transformation factor negatively. A change of the transformation factor of a single frequency component in relation to another frequency component leads to a higher ripple of the entire system. Since the demodulated low frequency partial signal comprises a high noise level, it is necessary to perform a low pass filtering before combining the signal with the high frequency partial signal. Dependent upon the order of the filter used, this leads to a phase error after adding the signals. This again can be seen in a high ripple of the frequency transmission function of the system.

According to one embodiment, the present invention is able to alleviate the both above-mentioned disadvantageous. The disadvantage of time delay is compensated by preferably using a sample-hold-device. The bandwidth of the transformer used for transforming the low frequency partial signal may be significantly higher than the modulation frequency. The output signal therefore may be almost ideally rectangular. For reaching an optimal sample, it is therefore not necessary to exactly match the optimal sample time in the middle of each pulse of the rectangular signal. On the other hand, the sample and hold device produces an additional delay of the low frequency signal in comparison to the high frequency partial signal of half a modulation period. This may further increase the negative effect of the low pass filter removing the noise from the demodulated low frequency partial signal. Advantageously, this delay can be halved by reversing the sequence of the demodulator and the sample and hold device. In this case, there exist at least two samples per demodulation phase. The demodulation then may use stepped sample hold signals. The time delay, though, may only be reduced to half of the original time delay.

According to another embodiment, in order to compensate this time delay, the second low pass filter used in the difference method for separating the high frequency partial signal and the low frequency partial signal can be preferably used. Since the frequency splitting is mainly characterized by the low pass cut-off frequency of the first low pass filter, a combination of the signals in the region of this cut-off frequency in a phase-true manner may be important for the frequency characteristics of the coupler. A phase-true combination can be reached when the second low pass filter produces a group delay, which is comparable to the group delay of the low pass noise filter and the sample hold device used after demodulation.

In another embodiment, the second low pass filter used for the difference method may be of the same filter type and order as the noise removal filter.

An isolation coupler may include a frequency splitter for splitting an input signal into a low frequency partial signal and a high frequency partial signal and a first isolating transformer for transforming a signal derived from the high frequency partial signal resulting in a transformed high frequency partial signal. Moreover it may include a modulator for modulating the low frequency partial signal with a modulation signal resulting in a modulated low frequency partial signal and a second isolating transformer for transforming a signal derived from the modulated low frequency partial signal resulting in a transformed low frequency partial signal. It is therefore possible to couple—galvanically separated—the entire signal with a high bandwidth.

In yet another embodiment, the isolation coupler further may include a demodulator for demodulating the transformed low frequency partial signal using a demodulation signal resulting in a demodulated low frequency partial signal and a combiner for combining the transformed high frequency partial signal and a signal derived from the demodulated low frequency partial signal resulting in an output signal. With this configuration a high signal-to-noise ratio can be reached.

In one embodiment, the modulation signal is a rectangle signal of at least double the frequency of the highest frequency component of the partial low frequency signal. This way, it can be guaranteed that the entire low frequency partial signal is transformed. Alternatively also a sine signal or any other periodic signal can be used.

In yet another embodiment, the isolation coupler further includes a sample hold device for sampling and holding a signal derived from the transformed low frequency partial signal resulting in a sampled low frequency partial signal. The exact timing of the demodulation loses its impact on signal accuracy.

Advantageously, the isolation coupler further includes an artifact removal low pass filter for removing undesired signal components from a signal derived from the transformed low frequency partial signal resulting in a filtered transformed low frequency partial signal. Demodulation artifacts are removed resulting in an increase in signal-to-noise-ratio.

In one embodiment, the frequency splitter comprises a first low pass filter for filtering the input signal resulting in the low frequency partial signal, a second low pass filter for filtering the low frequency partial signal resulting in a filtered low frequency partial signal and a combiner for subtracting the filtered low frequency partial signal from the input signal resulting in the high frequency partial signal. The frequency splitting is therefore performed efficiently. The combiner can be an adder or subtractor.

In one embodiment, the second low pass filter is set up for compensating an envelope delay of the filtered transformed low frequency partial signal in regard to the transformed high frequency partial signal. The envelope delay may be produced by the first low pass filter and the sample hold device. A reduction in signal quality is therefore prevented.

Preferably, the isolation coupler further includes a third isolating transformer for transforming the modulation signal to the modulator. This prevents undesired coupling of signal components through the modulation signal line.

In another embodiment, the isolation coupler further comprises
a first amplifier for amplifying the high frequency partial signal before transformation through the first isolation transformer and/or a second amplifier for creating the transformed high frequency partial signal after transformation through the first isolation transformer and/or a third amplifier for amplifying the low frequency partial signal before transformation through the second isolation transformer and/or a fourth amplifier for creating the transformed low frequency partial signal after transformation through the second isolation transformer, and/or a fifth amplifier for amplifying a signal, the modulation signal is derived from and a sixth amplifier for creating the modulation signal. This allows for a low noise coupling of the signals.

An method for isolation coupling may include the steps of splitting an input signal into a low frequency partial signal and a high frequency partial signal, transforming a signal derived from the high frequency partial signal using a first isolating transformer resulting in a transformed high frequency partial signal, modulating the low frequency partial signal with a modulation signal resulting in a modulated low frequency partial signal, and transforming a signal derived from the modulated low frequency partial signal using a second isolating transformer resulting in a transformed low frequency partial signal. It is therefore possible to transform—galvanically separated—the entire signal with a high bandwidth.

BRIEF DESCRIPTION OF THE DRAWINGS

An exemplary embodiment of the invention is now further explained with respect to the drawings, in which.

Figure 1:
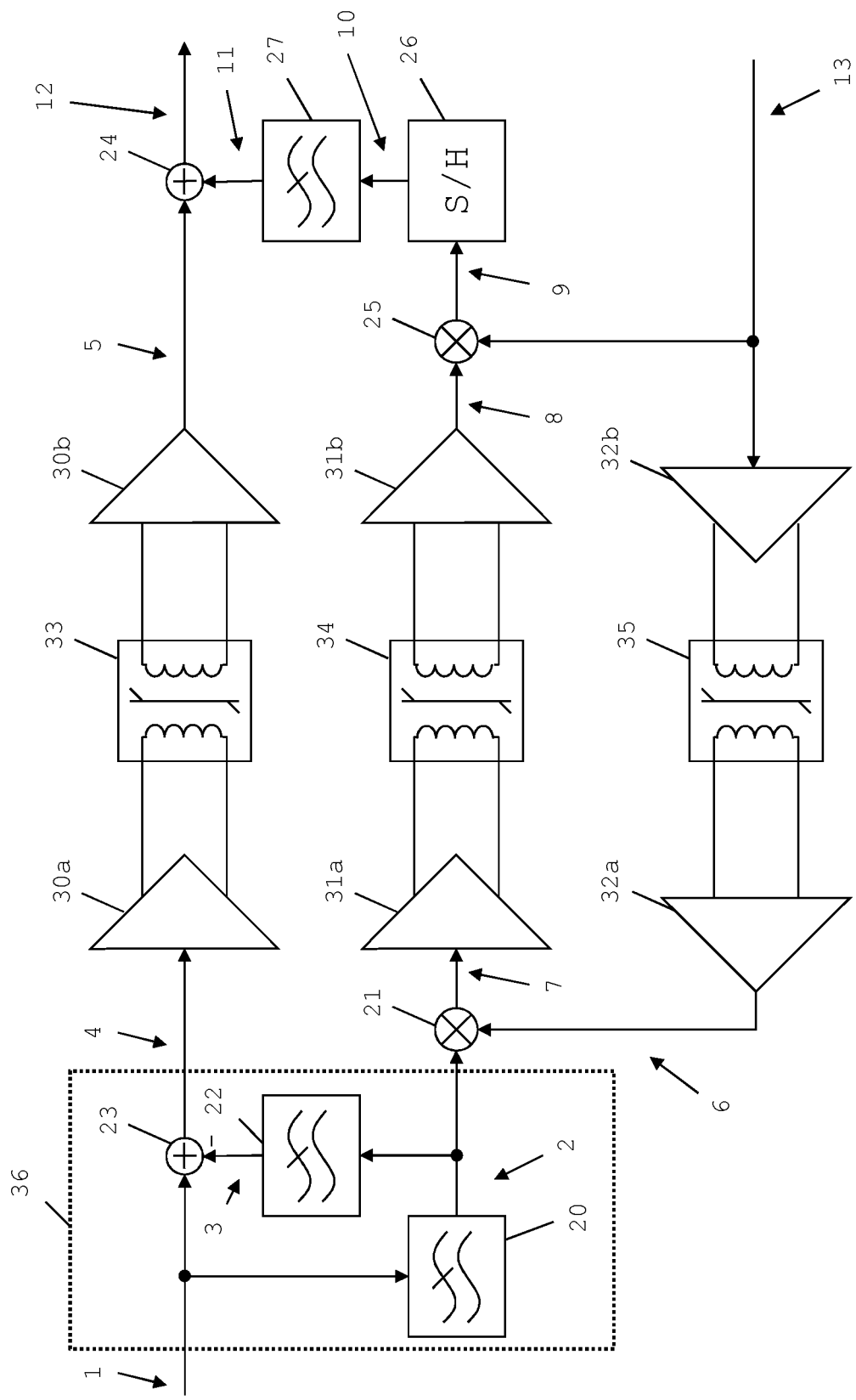
FIG. 1 shows a block diagram of an embodiment of a coupler.

First, we demonstrate the configuration and function of an embodiment of the coupler according to FIG. 1. After that, we described the function of the method in detail along FIG. 2. Similar entities and reference numbers in different figures have been omitted.

FIG. 1 shows an embodiment of the isolation coupler. It comprises a frequency splitter 36 connected to a first amplifier 30a and a modulator 21. The first amplifier 30a is furthermore connected to a first isolating transformer 33, which in turn is connected to a second amplifier 30b. The second amplifier 30b again is connected to an adder 24, which is in more general terms a combiner. The modulator 21 is connected to a third amplifier 31a, which again is connected to a second isolation transformer 34. It is connected to a fourth amplifier 31b which again is connected to a demodulator 25. The demodulator 25 is connected to a sample hold-device 26, which in turn is connected to an artifact removal low pass filter 27. This filter 27 again is connected to the adder 24. Moreover, a fifth amplifier 32a is connected to the modulator 21. The fifth amplifier 32a is furthermore connected to a third isolating transformer 35, which again is connected to a sixth amplifier 32b. The input of the sixth amplifier 32b is furthermore connected to the demodulator 25.

The frequency splitter 36 furthermore includes a first low pass filter 20. Moreover, it includes a second low pass filter 22 and a combiner, more specifically an adder 23. An input of the first low pass filter 20 is connected to an input of the adder 23. An output of the first low pass filter 20 is connected to an input of the second low pass filter 22. An output of the second low pass filter 22 is connected to a negative input of the adder 23.

An output of the adder 23 is connected to the first amplifier 30a. The output of the first low pass filter 20 is connected to the modulator 21.

The isolation coupler is provided with an input signal 1. The input signal 1 is provided to the first low pass filter 20. The first low pass filter 20 filters the input signal resulting in a low frequency partial signal 2. This signal 2 is provided to the second low pass filter 22, which filters it and produces a filtered low frequency partial signal 3. The input signal 1 and the filtered low frequency partial signal 3 are provided to the adder 23. The adder 23 subtracts the filtered low frequency partial signal 3 from the input signal 1. This results in a high frequency partial signal 4. The signal 4 is provided to the first amplifier 30a, amplified and transmitted to the isolation transformer 33, which performs the galvanic decoupling. The transformation by the first isolating transformer 33 is a 1:1 transformation. Alternatively a different transformation ratio can be applied. The resulting signal is provided to the second amplifier 30b, which creates a resulting transformed high frequency partial signal 5. The signal 5 is provided to the adder 24.

Moreover, the low frequency partial signal 2 is provided to the modulator 21. A demodulation signal 13 is furthermore provided to the demodulator 5 and to the sixth amplifier 32b. The amplifier 32b amplifies it and transmits it to the third isolation transformer 35. The isolation transformer 35 performs the galvanic decoupling and provides the signal to the fifth amplifier 32a, which amplifies it and thereby creates the modulation signal 6. Also the transformation by the third isolating transformer 35 is a 1:1 transformation. Alternatively a different transformation ratio can be applied. The modulation signal 6 is provided to the modulator 21. The modulator 21 modulates the low frequency partial signal 2 using the modulation signal 6. Since the modulation signal 6 is of significantly higher frequency than the highest frequency component of the low frequency partial signal 2, no information is lost due to this modulation.

The modulator thereby creates a modulated low frequency partial signal 7, which is provided to the third amplifier 31a which amplifies it and provides it to the second isolation transformer 34. The isolation transformer 34 performs the galvanic decoupling and provides the resulting signal to the fourth amplifier 31b. Also the transformation by the second isolating transformer 34 is a 1:1 transformation. Alternatively a different transformation ratio can be applied. The amplifier 31b creates a transformed low frequency partial signal 8 and provides it to the demodulator 25. The demodulator 25 demodulates the transformed low frequency partial signal 8 using the demodulation signal 13. The demodulation signal 13 is basically identical to the modulation signal 6. The resulting demodulated low frequency partial signal 9 is provided to the sample hold device 26 and sampled by this. The resulting sampled low frequency partial signal 10 is provided to the artifact removal filter 27 which preferably is a low pass filter. This filtering results in a filtered transformed low frequency partial signal 11, which is added to the high frequency partial signal 5 by the adder 24. The resulting signal 12 is the galvanically decoupled output signal 12 which corresponds to the input signal 1.

The second low pass filter 22 is set up for compensating an envelope delay of the filtered transformed low frequency partial signal 11 in regard to the transformed high frequency partial signal 5. The envelope delay is produced by the first low pass filter 20 and the sample hold device 26. Preferably, the second low pass filter 22 is of the same filter type and order as the artifact compensation filters 25.

Alternatively, the demodulator 25 and the sample and hold device 26 can change positions. Then the fourth amplifier 31b provides its output signal to the sample and hold device 26. The resulting signal is then provided to the demodulator 25. This results in a reduction in the resulting envelope delay. Moreover, the third isolation transformer 35, the fifth amplifier 32a and the sixth amplifier 32b are merely optional. It is possible to provide independent signals 6 and 13 to the modulator 21 and the demodulator 25. Also it is possible to provide synchronous signals by any other method than using an isolation transformer.

Moreover, the use of the difference method employing a first low pass filter 20 and a second low pass filter 22 in the frequency splitter 36 is not necessary. Also different methods of frequencies splitting are possible.

Figure 2:
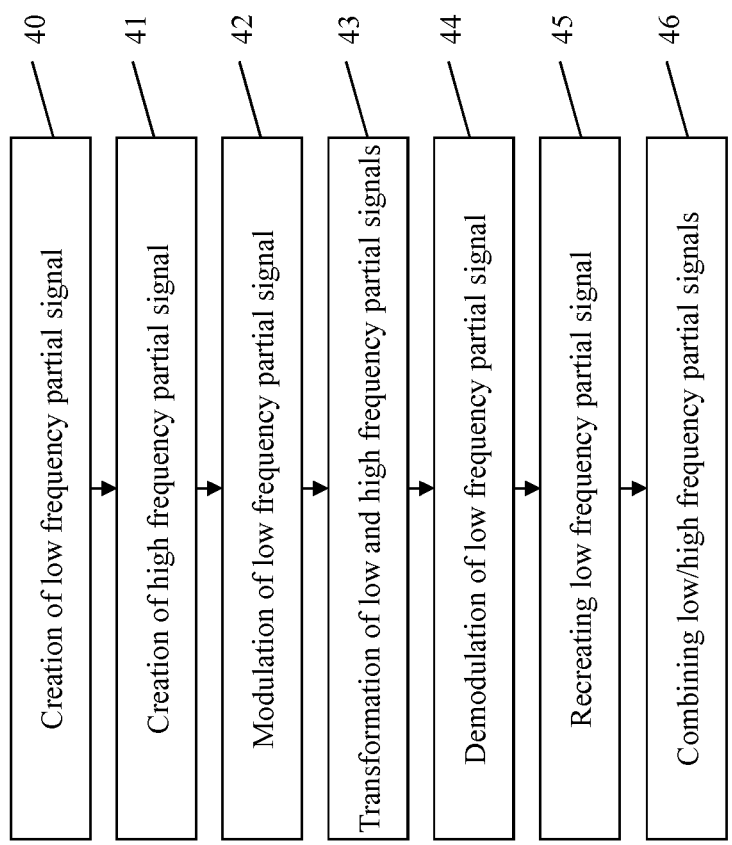
FIG. 2 shows a flow chart of an embodiment of the method.

FIG. 2 shows an embodiment of the method. In a first step 40, a low frequency partial signal is generated. In a second step 41, a high frequency partial signal is created. The low frequency partial signal and the high frequency partial signal are created based upon an input signal. In a third step 42, the low frequency partial signal is modulated with a modulation signal. The modulation signal has at least double the frequency of the highest frequency component of the low frequency partial signal.

In a fourth step 43, the low frequency partial signal and the high frequency partial signal are transformed using for example isolation transformers. In a fifth step 44, the low frequency partial signal that has been transformed is demodulated using an according demodulation signal. In a sixth step 45, the demodulated low frequency partial signal is recreated by use of, for example, a sample/hold device and/or a further filter. In this step, an envelope delay of the low frequency partial signal regarding the high frequency partial signal is compensated. Finally, in a seventh step 46, the resulting low frequency partial signal and high frequency partial signal are combined.

The invention is not limited to the examples shown above. The characteristics of the embodiments can be used in any combination.

The invention claimed is:
1. An isolation coupler comprising:
   a frequency splitter for splitting an input signal into a low frequency partial signal and a high frequency partial signal,
   a first isolating transformer for transforming a signal derived from the high frequency partial signal in a transformed high frequency partial signal,
   a modulator for modulating the low frequency partial signal with a modulation signal resulting in a modulated low frequency partial signal,
   a second isolating transformer for transforming a signal derived from the modulated low frequency partial signal in a transformed low frequency partial signal,
   a demodulator for demodulating the transformed low frequency partial signal using a demodulation signal resulting in a demodulated low frequency partial signal, and
   a combiner for combining the transformed high frequency partial signal and a signal derived from the demodulated low frequency partial signal resulting in an output signal.

2. The isolation coupler according to claim 1, wherein the modulation signal is a rectangle signal of at least double the frequency of the highest frequency component of the partial low frequency signal.

3. The isolation coupler according to claim 1, further comprising a sample hold device for sampling and holding a signal derived from the transformed low frequency partial signal resulting in a sampled low frequency partial signal.

4. The isolation coupler according to claim 1, further comprising an artifact removal low pass filter for removing undesired signal components from a signal derived from the transformed low frequency partial signal resulting in a filtered transformed low frequency partial signal.

5. The isolation coupler according to claim 1, wherein the frequency splitter comprises:
   a first low pass filter for filtering the input signal resulting in the low frequency partial signal,
   a second low pass filter for filtering the low frequency partial signal resulting in a filtered low frequency partial signal, and
   a combiner for subtracting the filtered low frequency partial signal from the input signal resulting in the high frequency partial signal.

6. The isolation coupler according claim 5,
   wherein the second low pass filter is set up for compensating an envelope delay of the filtered transformed low frequency partial signal in regard to the transformed high frequency partial signal, and
   wherein the envelope delay is produced by the first low pass filter and the sample hold device.

7. The isolation coupler according to claim 1, wherein the isolation coupler further comprises:
   a first amplifier for amplifying the high frequency partial signal before being transformed by the first isolation transformer and/or a second amplifier for creating the transformed high frequency partial signal after being transformed by the first isolation transformer, and/or
   a third amplifier for amplifying the low frequency partial signal before being transformed by the second isolation transformer and/or a fourth amplifier for creating the transformed low frequency partial signal after being transformed by the second isolation transformer.

8. A method for isolation coupling, comprising steps of:
   splitting an input signal into a low frequency partial signal and a high frequency partial signal,
   transforming a signal derived from the high frequency partial signal using a first isolating transformer in a transformed high frequency partial signal,
   modulating the low frequency partial signal with a modulation signal resulting in a modulated low frequency partial signal,
   transforming a signal derived from the modulated low frequency partial signal using a second isolating transformer in a transformed low frequency partial signal,
   demodulating the transformed low frequency partial signal using a demodulation signal resulting in a demodulated low frequency partial signal, and
   combining the transformed high frequency partial signal and a signal derived from the demodulated low frequency partial signal resulting in an output signal.

9. The method according to claim 8, wherein the modulation signal is a rectangle signal of at least double the frequency of the highest frequency component of the partial low frequency signal.

10. The method according to claim 8, further comprising:
    sampling and holding a signal derived from the transformed low frequency partial signal resulting in a sampled low frequency partial signal.

11. The method according to claim 8, further comprising:
    removing undesired signal components from a signal derived from the transformed low frequency partial signal resulting in a filtered transformed low frequency partial signal.

12. The method according to claim 8, further comprising:
    filtering the input signal resulting in the low frequency partial signal,
    filtering the low frequency partial signal resulting in a filtered low frequency partial signal, and
    subtracting the filtered low frequency partial signal from the input signal resulting in the high frequency partial signal.

13. The method according claim 12,
    wherein the filtering of the low frequency partial signal is performed so that an envelope delay of the filtered transformed low frequency partial signal in regard to the transformed high frequency partial signal is compensated, and
    wherein the envelope delay is produced by filtering the input signal and by sampling and holding the demodulated low frequency partial signal.

* * * * *